(12) United States Patent
Varghese et al.

(10) Patent No.: US 11,177,414 B2
(45) Date of Patent: Nov. 16, 2021

(54) OPTOELECTRONIC COMPONENT AND METHOD FOR PRODUCING AN OPTOELECTRONIC COMPONENT

(71) Applicant: Osram OLED GmbH, Regensburg (DE)

(72) Inventors: Tansen Varghese, Regensburg (DE); Stefan Illek, Donaustauf (DE)

(73) Assignee: OSRAM OLED GMBH, Regensburg (DE)

( * ) Notice: Subject to any disclaimer, the term of this patent is extended or adjusted under 35 U.S.C. 154(b) by 47 days.

(21) Appl. No.: 16/630,495

(22) PCT Filed: Jul. 12, 2018

(86) PCT No.: PCT/EP2018/069035
§ 371 (c)(1),
(2) Date: Jan. 13, 2020

(87) PCT Pub. No.: WO2019/012084
PCT Pub. Date: Jan. 17, 2019

(65) Prior Publication Data
US 2020/0168766 A1 May 28, 2020

(30) Foreign Application Priority Data
Jul. 13, 2017 (DE) ...................... 10 2017 115 794.8

(51) Int. Cl.
*H01L 33/00* (2010.01)
*H01L 33/22* (2010.01)
(Continued)

(52) U.S. Cl.
CPC .......... *H01L 33/22* (2013.01); *H01L 33/0066* (2013.01); *H01L 33/0093* (2020.05);
(Continued)

(58) Field of Classification Search
CPC ... H01L 33/22; H01L 33/382; H01L 33/0066; H01L 33/0093; H01L 33/30;
(Continued)

(56) References Cited

U.S. PATENT DOCUMENTS 6,278,136 B1  8/2001  Nitta
9,773,945 B2 *  9/2017  Meitl .................. H01L 33/0095
(Continued)

FOREIGN PATENT DOCUMENTS

DE  102009019161 A1  11/2010
DE  102012217533 A1  3/2014
(Continued)

OTHER PUBLICATIONS

International search report based on PCT/EP2018/069035, dated Sep. 28, 2018; 6 pages (4 pages + 2 pages English Translation) (for reference purposes only).
(Continued)

*Primary Examiner* — Savitri Mulpuri
(74) *Attorney, Agent, or Firm* — Viering, Jentschura & Partner mbB (57) ABSTRACT

An optoelectronic component may include a semiconductor body and a radiation transmissive bonding layer. The semiconductor body may include a first region of a first conductivity type, a second region of a second conductivity type, and an active region. The active region may be disposed between the first region and the second region. The first region may include a recess and a contact region adjacent to the recess. The active region may be arranged to emit electromagnetic radiation. The semiconductor body may have a first radiation exit surface at a main surface of the second region remote from the active region, and a portion of the electromagnetic radiation may exit the semiconductor body through the first radiation exit surface. The semicon-
(Continued)

ductor body may include a first electrical connection layer and a second electrical connection layer where the second electrical connection layer is arranged at least partially in the recess.

14 Claims, 5 Drawing Sheets

(51) Int. Cl.
    *H01L 33/30*     (2010.01)
    *H01L 33/38*     (2010.01)
(52) U.S. Cl.
    CPC ............ *H01L 33/30* (2013.01); *H01L 33/382* (2013.01); *H01L 2933/0016* (2013.01)
(58) Field of Classification Search
    CPC ..... H01L 33/305; H01L 33/025; H01L 33/44; H01L 33/26; H01L 33/14
    See application file for complete search history.

(56) References Cited

U.S. PATENT DOCUMENTS

| | | |
|---|---|---|
| 2008/0054290 A1 | 3/2008 | Shieh et al. |
| 2012/0112226 A1* | 5/2012 | Grolier ................ H01L 33/382 |
| | | 257/98 |
| 2013/0099272 A1 | 4/2013 | von Malm |
| 2015/0255685 A1 | 9/2015 | Herrmann et al. |
| 2016/0049543 A1 | 2/2016 | Meyer et al. |
| 2017/0133566 A1 | 5/2017 | Herrmann et al. |
| 2020/0144446 A1* | 5/2020 | Varghese ................ H01L 33/22 |

FOREIGN PATENT DOCUMENTS

| | | |
|---|---|---|
| DE | 102013103601 A1 | 10/2014 |
| DE | 102014103828 A1 | 9/2015 |

OTHER PUBLICATIONS

German search report based on DE102017115794.8, dated Apr. 16, 2018; 7 pages (for reference purposes only).

* cited by examiner

OPTOELECTRONIC COMPONENT AND METHOD FOR PRODUCING AN OPTOELECTRONIC COMPONENT

CROSS-REFERENCE TO RELATED APPLICATIONS

The present application is a national stage entry according to 35 U.S.C. § 371 of PCT application No.: PCT/EP2018/069035 filed on Jul. 12, 2018; which claims priority to German Patent Application Serial No.: 10 2017 115 794.8, which was filed on Jul. 13, 2017; both of which are incorporated herein by reference in their entirety and for all purposes.

TECHNICAL FIELD

An optoelectronic component and a method for manufacturing an optoelectronic component are described, in particular, a radiation-emitting optoelectronic component that emits electromagnetic radiation, for example light, during operation.

BACKGROUND

One task to be solved is to specify an optoelectronic component that has improved efficiency.

Another task is to specify a method for manufacturing such an optoelectronic component.

SUMMARY

According to at least one embodiment of the optoelectronic component, the optoelectronic component includes a semiconductor body having a first region of a first conductivity type, a second region of a second conductivity type, and an active region. The active region lies between the first region and the second region and is designed for generating electromagnetic radiation. In a non-limiting embodiment, the regions of the semiconductor body are epitaxially grown. The active region may include a pn junction, a double heterostructure, a single quantum well (SQW) or, such as a multi quantum well (MQW) for radiation generation.

According to at least one embodiment of the optoelectronic component, the optoelectronic component includes a recess in the first region of the semiconductor body. This recess is transverse to the main extension plane of the semiconductor body. The main extension plane is transverse, in particular perpendicular, to the growth direction and/or to the stacking direction of the semiconductor body. Thus, the recess extends substantially along, such as parallel to, the growth direction and/or the stacking direction of the semiconductor body. The recess can have the shape of a trench, a cylinder or a truncated cone, for example. The cylinder axis or the truncated cone axis is arranged orthogonal to the main extension plane of the semiconductor body.

According to at least one embodiment of the optoelectronic component, the optoelectronic component includes a contact region adjacent to the recess. This contact region is used for electrical contacting of the semiconductor body.

According to at least one embodiment of the optoelectronic component, the optoelectronic component includes a semiconductor body with a first radiation exit surface. This first radiation exit surface is arranged on a main surface of the second region of the semiconductor body facing away from the active region. The first radiation exit surface is arranged such that at least part of the electromagnetic radiation generated during operation leaves the semiconductor body through the first radiation exit surface.

According to at least one embodiment of the optoelectronic component, the optoelectronic component includes a semiconductor body having a first electrical connection layer and a second electrical connection layer. The electrical connection layers can, for example, be made of a metal. The first electrical connection layer is used to make electrical contact with the first region of the semiconductor body. The second electrical connection layer is used to make electrical contact with the second region of the semiconductor body. The first and second electrical connection layers are arranged on the side of the first region facing away from the active region. The first radiation exit surface is free of electrical connection layers. The second electrical connection layer is arranged at least partially in the recess.

According to at least one embodiment of the optoelectronic component, the optoelectronic component includes a radiation transmissive carrier which is arranged downstream of the first radiation exit surface. The radiation transmissive carrier is materially bonded to the semiconductor body by means of a radiation transmissive bonding layer. The radiation transmissive carrier can be made of a material such as sapphire, glass, gallium phosphide or silicon carbide. The radiation transmissive bonding layer can, for example, be a dielectric layer. For example, the bonding layer can be formed from a benzocyclobutene (BCB)-based polymer, a silicon oxynitride (SiOxNy), a titanium oxide (TiOx) or an aluminum oxide (AlOx).

According to at least one embodiment of the optoelectronic component, the optoelectronic component includes,
  a semiconductor body including a first region of a first conductivity type, a second region of a second conductivity type, and an active region disposed between said first region and said second region,
  a recess in the first region of the semiconductor body,
  a contact region adjacent to the recess, wherein
  the active region of the semiconductor body is designed to emit electromagnetic radiation,
  the semiconductor body has a first radiation exit surface at a main surface of the second region facing away from the active region,
  at least part of the electromagnetic radiation generated in operation leaves the semiconductor body through the first radiation exit surface,
  the semiconductor body includes a first electrical connection layer and a second electrical connection layer, wherein
  the second electrical connection layer is arranged at least partially in the recess, and
  a radiation transmissive carrier is arranged downstream of the first radiation exit surface, which carrier is materially bonded to the semiconductor body by means of a radiation transmissive bonding layer.

An optoelectronic component described here is based, among other things, on the consideration that it is advantageous for high optical efficiency to use a material with low optical absorption, such as gallium phosphide, for the second region of the semiconductor body. At the same time, gallium phosphide has good properties as a current expansion layer due to its high transverse conductivity. However, gallium phosphide has the disadvantage that it only enters into an ohmic, i.e. highly electrically conductive, contact with a metal at high temperatures. Many bonding materials that are needed to fix the radiation transmissive carrier are not stable at high temperatures.

The optoelectronic component described here now makes use, among other things, of the idea of realizing electrical contacting by appropriate doping by means of a previously performed diffusion and/or implantation of a p-dopant material, such as zinc, carbon and/or magnesium. Furthermore, the use of a high-temperature stable bonding material can also enable contact formation between the metal of the electrical connection layer and the semiconductor material. In this case, the contact formation may also include a high temperature process step.

According to at least one embodiment of the optoelectronic component, the first region and/or active region of the semiconductor body is based on an indium gallium aluminum phosphide compound semiconductor material. This semiconductor material is particularly suitable for optoelectronic components, such as with an emission in the red or yellow spectral range.

"Based on indium gallium aluminum phosphide compound semiconductors" in this context means that the first region, respectively the active region may include $Al_nGa_mIn_{1-n-m}P$, wherein $0 \leq n \leq 1$, $0 \leq m \leq 1$ and $n+m \leq 1$, such as with $n \neq 0$ and/or $m \neq 0$. In another non-limiting embodiment, the active region contains $Al_nGa_mIn_{1-n-m}P$, wherein $0 \leq n \leq 1$, $0 \leq m \leq 1$ and $n+m < 1$. This material does not necessarily have to have a mathematically exact composition according to the above formula. Rather, it may contain one or more dopants as well as additional components which essentially do not change the physical properties of the material. For simplicity's sake, however, the above formula contains only the essential components of the crystal lattice (Al, Ga, In, P), even if these may be partially replaced by small amounts of other substances.

According to at least one embodiment of the optoelectronic component, the second region of the semiconductor body is based on a gallium phosphide compound semiconductor material. This means that the second region of the semiconductor body contains or consists of a gallium phosphide compound semiconductor material. Compared to other compound semiconductor materials, such as compound semiconductor materials based on aluminum gallium arsenide, gallium phosphide is characterized by an advantageously low absorption of electromagnetic radiation, especially in the red or yellow spectral range.

"Gallium phosphide compound semiconductor based" in this context means that the second region includes $Al_nGa_mIn_{1-n-m}P$, wherein $0 \leq n \leq 1$, $0 < m \leq 1$ and $n+m \leq 1$, such as with $m=1$ and $n=1$. Thereby, this material does not necessarily have to have a mathematically exact composition according to the above formula. Rather, it may contain one or more dopants and additional components which essentially do not change the physical properties of the material. For the sake of simplicity, the above formula contains only the essential components of the crystal lattice (Al, Ga, In, P), even if these may be partially replaced by small amounts of other substances.

According to at least one embodiment of the optoelectronic component, a doping material of the second conductivity type is introduced into the contact region. This means, for example, that diffusion and/or implantation of zinc, carbon or magnesium takes place in the contact region. This can advantageously result in a higher density of free charge carriers, resulting in good electrical contact between the second region of the semiconductor body and the second electrical connection layer.

According to at least one embodiment of the optoelectronic component, the extent of the contact region along the main extension plane of the semiconductor body corresponds to the extent of the recess along the main extension plane of the semiconductor body. The term "corresponds" means that the width of the recess does not deviate from the width of the contact region by more than 50%, such as by more than 25%, and alternatively by more than 10%. By such a corresponding expansion along the main extension plane a later lateral alignment of the recess to the contact region with the aim of a large overlapping of the recess and the contact region is simplified. The contact region can be both larger and smaller than the recess. The recess can also be adjacent to the contact region and be the same size as the contact region. Both the recess and the contact region are advantageously kept as small as possible in order to minimize electrical and optical losses due to a reduced area of the active region and increased optical absorption. The minimum size of the contact region and the recess results from the requirement to keep the contact resistance sufficiently low at a given electrical operating current with a given luminous efficacy. The overlap of the contact region and the recess can result, for example, from the manufacturing tolerances.

According to at least one embodiment of the optoelectronic component, the recess does not completely penetrate the first region of the semiconductor body. Compared to a recess completely penetrating the active region, a non-radiative recombination at the interface of the recess, especially in the active region, can be reduced advantageously. If the active region is not penetrated by the recess, the area for non-radiative recombination is advantageously reduced.

According to at least one embodiment of the optoelectronic component, the radiation transmissive bonding layer contains a silicon oxynitride, a titanium oxide or an aluminum oxide. These materials have an increased temperature stability compared to a BCB-based polymer, for example, which can be an advantage in a later high-temperature process.

According to at least one embodiment of the optoelectronic component, the optical refractive index of the radiation transmissive bonding layer deviates from the optical refractive index of the radiation transmissive carrier by a maximum of 10%, such as by a maximum of 5%, and alternatively by a maximum of 1%. The optical refractive index of a bonding layer of silicon oxynitride, for example, can be adjusted in a wide range from about 1.4 to about 2.1 based on the stoichiometric composition of the silicon oxynitride. By adjusting the refractive index of the bonding layer in this way, the total internal reflection which occurs at the transition from the bonding layer to the substrate is advantageously reduced.

According to at least one embodiment of the optoelectronic component, the optoelectronic component has a second radiation exit surface on the main surface of the first region facing away from the active region, through which at least part of the electromagnetic radiation generated leaves the optoelectronic component.

This means that the optoelectronic component is capable of emitting electromagnetic radiation on both sides.

According to at least one embodiment of the optoelectronic component, the first radiation exit surface and/or the second radiation exit surface are roughened. This roughening reduces the so-called optical waveguide effect. The optical waveguide effect is based on the total internal reflection of electromagnetic radiation occurring at transparent interfaces. The reduction of the optical waveguide effect advantageously increases the outcoupling efficiency of the optoelectronic component.

According to at least one embodiment, a method for manufacturing an optoelectronic component includes the following steps:

A) providing a growth substrate having a semiconductor body grown thereon, including a first region of a first conductivity type and a second region of a second conductivity type, wherein said first region is arranged between said growth substrate and said second region, and wherein said active region is disposed between said first region and said second region. The regions are epitaxially grown on the growth substrate.

B) Creating a contact region in the second region. This means that a contact region is created within the second region to electrically contact the second region with the second connection layer.

C) Application of a radiation transmissive bonding layer on the first radiation exit surface. This radiation transmissive bonding layer may be formed from a BCB polymer, for example.

D) Application of a radiation transmissive carrier on the side of the radiation transmissive bonding layer facing away from the active region. The carrier can be formed from a glass, sapphire, gallium phosphide or silicon carbide.

E) Detaching the growth substrate from the side of the first region remote from the active region. The growth substrate is detached from the side of the first region facing away from the active region by means of a laser lift-off process, for example, or thinned by a grinding process and then removed by an etching process.

F) forming a recess in the first region, the recess extending transverse to the main plane of extension of the first region and extending to the contact region. The recess can be produced by an etching process, for example.

G) depositing a first and a second electrical connection layer on the side of the first region remote from the active region. For example, the electrical connection layers may be made of a metal. The second electrical connection layer serves for contacting the second region of the semiconductor body and is located at least partially in the recess.

According to at least one embodiment of the method for producing an optoelectronic component, the surface of the second region facing away from the active region is roughened to produce a first radiation exit surface before or after method step B). This means, for example, that the surface of the first radiation exit surface is roughened by chemical etching. A roughened surface reduces the optical waveguide effect and thus advantageously increases the outcoupling efficiency of the optoelectronic component.

According to at least one embodiment of the method for producing an optoelectronic component, the surface of the first region facing away from the active region is roughened to produce a second radiation exit surface before or after method step E). This means that the surface of the second radiation exit surface is roughened by chemical etching after the growth substrate has been removed. This increases the efficiency of a radiation emission in both directions.

According to at least one embodiment of the method for producing an optoelectronic component, method steps A) to G) are carried out in the sequence mentioned. In method step B), a dopant material is introduced into the semiconductor body to generate the contact region. The entire contact region has a conductivity of the second conductivity type. This means that a doping material such as zinc, carbon and/or magnesium is introduced into the contact region. This increases the free charge carrier concentration within the contact region and creates an ohmic contact, i.e. a good electrically conductive transition, between the second electrical connection layer and the second region of the semiconductor body is created.

According to at least one embodiment of the method for producing an optoelectronic component, the contact region of a second conductivity type produced in method step B) extends into the first region of the semiconductor body. The recess produced in method step G) does not penetrate the first region transverse to the main extension plane of the first region. This is an advantage in avoiding penetration of the active region. Thus, non-radiative recombination in the active region of the semiconductor body is advantageously kept low, which increases the optical efficiency of the optoelectronic component overall.

According to at least one embodiment of the method for producing an optoelectronic component, method step B) is carried out after method step G). In method step B), the second electrical connection layer is further electrically conductively connected to the second region by means of a high-temperature process step. This means that a contact region is formed within the second region by this high-temperature process step, which makes it possible to electrically connect the second region of the semiconductor body to the second electrical connection layer.

According to at least one embodiment of the method for producing an optoelectronic component, method step B) is carried out after method step F). In method step B), a doping material is introduced to produce the contact region, the entire contact region having a conductivity of the second conductivity type. This means that a doping material such as zinc is introduced into the second region of the semiconductor body to generate the contact region, resulting in an increased concentration of free charge carriers in this region and thus forming an ohmic, highly electrically conductive transition at the interface of the second electrical connection layer and the second region of the semiconductor body.

BRIEF DESCRIPTION OF THE DRAWINGS

Further advantages and advantageous designs and further embodiments of the optoelectronic component result from the following embodiments shown in connection with the figures.

Same, similar or similarly acting elements are provided with the same reference signs in the figures. The figures and the proportions of the elements shown in the figures are not to be regarded as true to scale. Rather, individual elements may be exaggeratedly large for better representability and/or better comprehensibility.

DETAILED DESCRIPTION

Figure 1A:
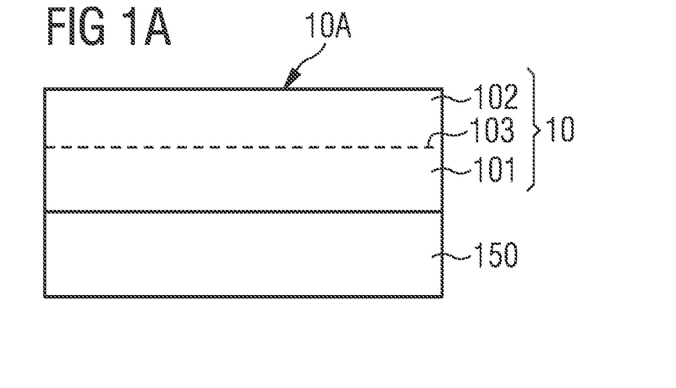
FIGS. 1A to 1E illustrate schematic cross-sections through an optoelectronic component according to a first exemplary embodiment in different steps of a method for its manufacturing, FIG. 2 illustrate a schematic cross-section through an optoelectronic component according to a second exemplary embodiment.

FIG. 1A shows a first step of a method to produce an optoelectronic component 1 according to a first exemplary embodiment. FIG. 1A shows a growth substrate 150 formed from a gallium arsenide compound semiconductor. By epitaxial growth, a first region 101 of a first conductivity type of a semiconductor body 10 is formed on this growth substrate 150. Thereupon an active region 103 and a second region 102 of a second conductivity type of the semiconductor body 10 are grown. The first region is formed of an indium gallium aluminum phosphide compound semiconductor and has an n-doping. The second region is formed of a gallium phosphide compound semiconductor and has a p-doping.

Figure 1B:
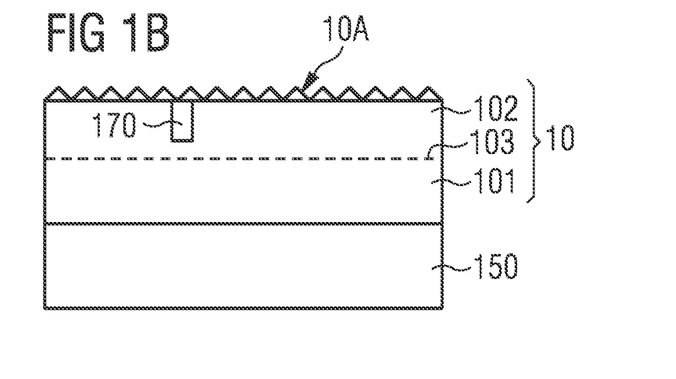

FIG. 1B shows a second step of a method for manufacturing an optoelectronic component 1 according to the first exemplary embodiment. In the second region 102 of the semiconductor body 10, a contact region 170 is generated, for example, by diffusion and/or implantation of zinc, carbon and/or magnesium. The first radiation exit surface 10A is then roughened.

Figure 1C:
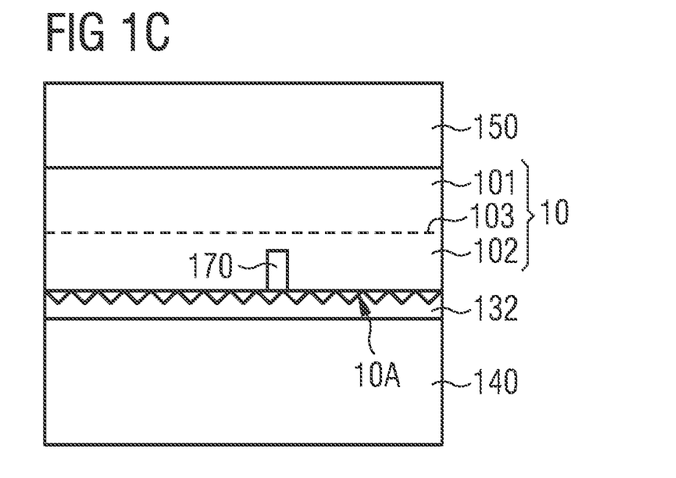

FIG. 1C shows a third step of a method for manufacturing an optoelectronic component 1 according to the first exemplary embodiment, in which a radiation transmissive bonding layer 132 is applied to the first radiation exit surface 10A. For example, the bonding layer 132 contains a BCB polymer. A radiation transmissive carrier 140 made of glass, sapphire, gallium phosphide or silicon carbide, for example, is arranged on the bonding layer 132 and materially bonded to the semiconductor body 10 by means of the bonding layer 132.

Figure 1D:
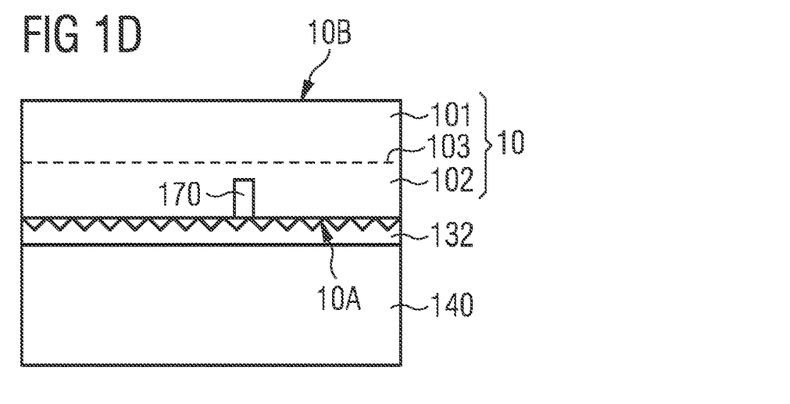

FIG. 1D shows a fourth step of a method for manufacturing an optoelectronic component 1 according to the first exemplary embodiment, in which the growth substrate 150 is detached from the semiconductor body 10, for example by means of a laser lift-off process, or is thinned by a grinding process and then removed by an etching process. This creates a second radiation exit surface 10B on the side of the first region 101 facing away from the active region 103.

Figure 1E:
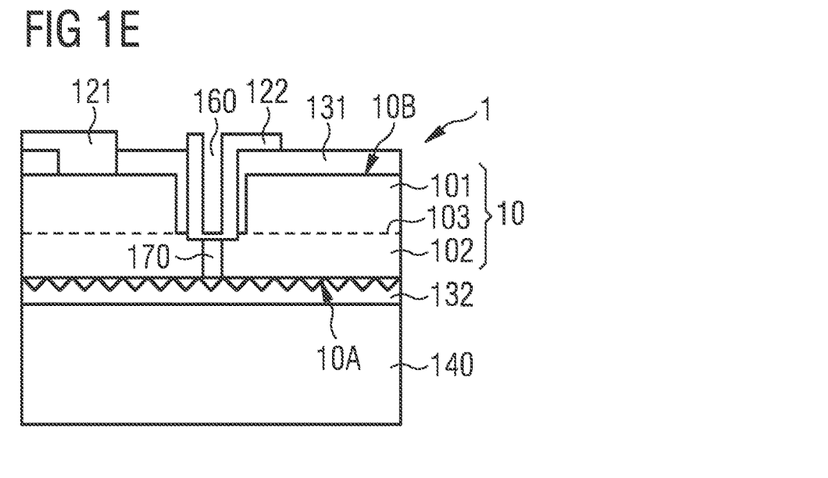

FIG. 1E shows a fifth step of a method for manufacturing an optoelectronic component 1 according to a first exemplary embodiment in which a recess 160 is made in the first region 101 transversely to the main extension plane of the semiconductor body 10 from the surface of the first region 101 facing away from the active region 103. The recess 160 completely penetrates the first region 101 as well as the active region 103. After depositing a radiation transmissive dielectric layer 131 on the second radiation exit surface 10B and on the walls of the recess 160, a first electrical connection layer 121 and a second electrical connection layer 122 are deposited. The second electrical connection layer 122 is partially arranged in the recess 160. By means of the first electrical connection layer 121, the first region 101 of the semiconductor body 10 is electrically contacted and by means of the second electrical connection layer 122, the second region 102 of the semiconductor body 10 is electrically contacted. This means that during operation of optoelectronic component 1, charge carriers are injected into the regions 101 and 102, which then recombine radiantly in the active region 103.

Figure 2:
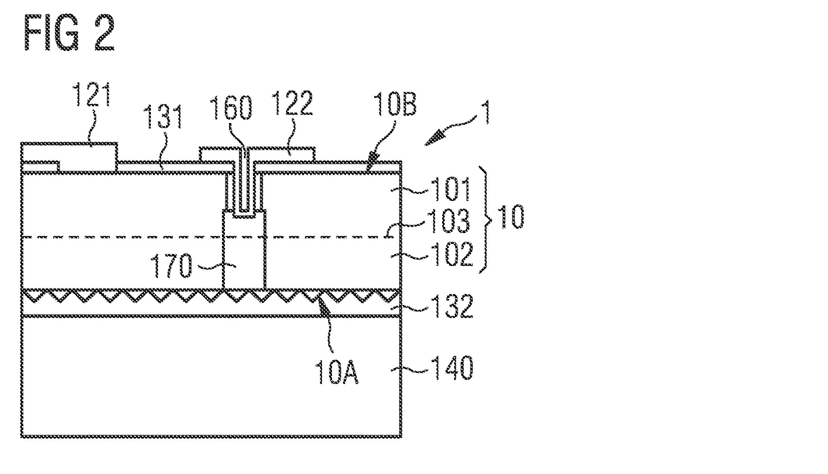

FIG. 2 shows a schematic cross-section through an optoelectronic component 1 according to a second exemplary embodiment. FIG. 2 corresponds to FIG. 1E except for the dimensions, in particular the depth, of the recess 160 and the contact region 170. The recess 160 shown in FIG. 2 is completely formed within the first region 101 of the semiconductor body 10. This means that the recess 160 does not completely penetrate the first region 101. In this second exemplary embodiment, the contact region 170 extends from the second region 102 through the active region 103 to the first region 101. This eliminates penetration of the active region 103 by the recess 160 and advantageously results in a smaller area for non-radiative recombination processes.

In an n-doped first region 101, the pn-junction formed within the first region 101 between the n-doped first region 101 and the p-doped contact region 170 does not represent a short circuit, since this pn-junction has a higher forward voltage than the pn-junction of the active region 103.

Figure 3A:
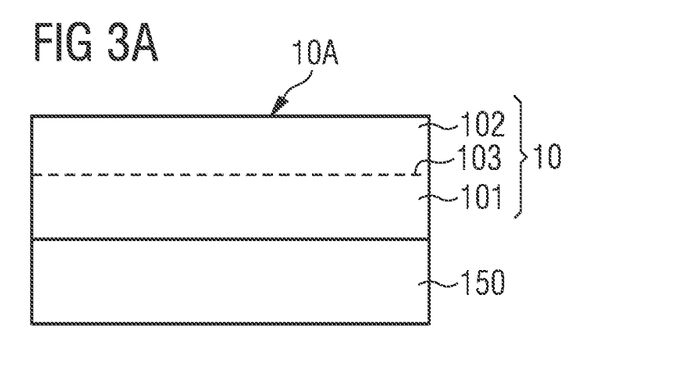
FIGS. 3A to 3F illustrate schematic cross-sections through an optoelectronic component according to a third exemplary embodiment in different steps of a method for its manufacturing.

FIG. 3A shows a first step of a method for manufacturing an optoelectronic component 1 according to a third exemplary embodiment. The first step corresponds to the first step shown in FIG. 1A of the first exemplary embodiment.

Figure 3B:
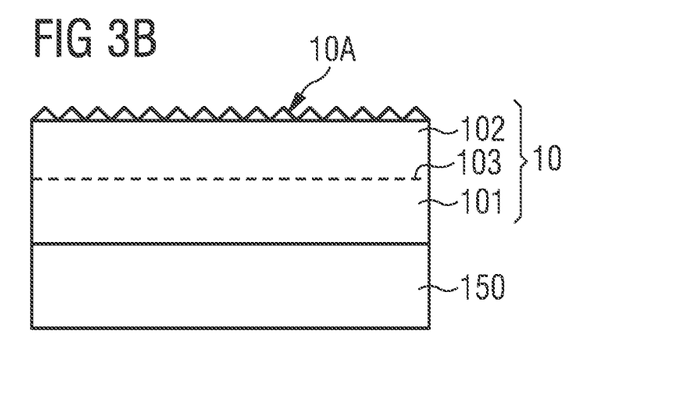

FIG. 3B shows a second step of a method for manufacturing an optoelectronic component 1 according to the third exemplary embodiment in which the first radiation exit surface 10A is roughened to improve the outcoupling efficiency.

Figure 3C:
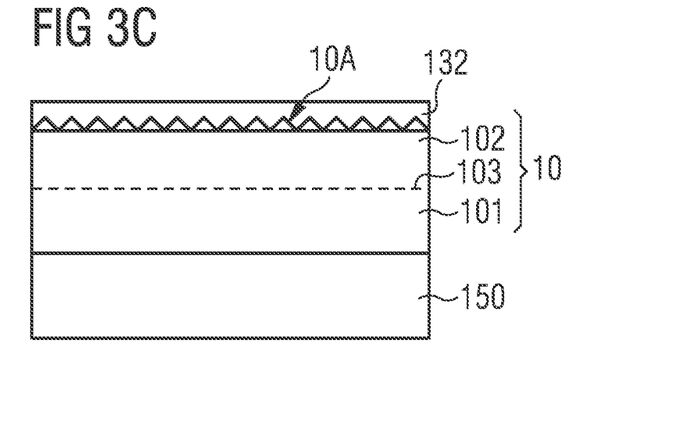

FIG. 3C shows a third step of a method for manufacturing an optoelectronic component 1 according to the third exemplary embodiment in which a radiation transmissive bonding layer 132 is applied to the first radiation exit surface 10A. Subsequently, the bonding layer 132 is planarized. This bonding layer 132, for example, is formed from a high-temperature stable silicon oxynitride.

Figure 3D:
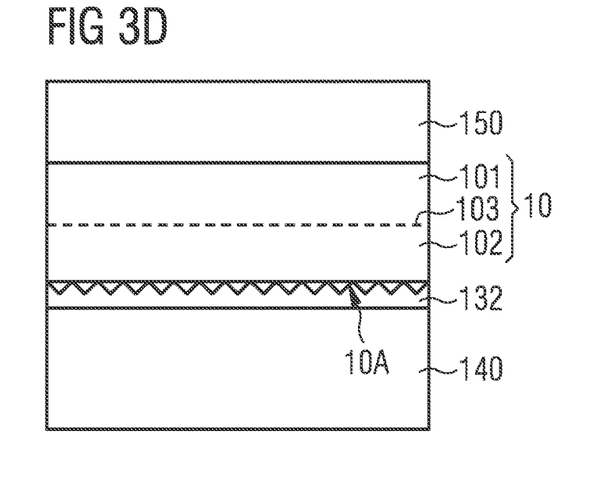

FIG. 3D shows a fourth step of a method for manufacturing an optoelectronic component 1 according to the third exemplary embodiment, in which a radiation transmissive carrier 140 formed from a glass, sapphire, gallium phosphide or silicon carbide, for example, is applied to the bonding layer 132. The optical refractive index of the bonding layer 132 can be matched to the optical refractive index of the carrier 140. This means that the refractive index of the bonding layer 132 deviates by a maximum of 10% from the refractive index of the carrier 140. Alternatively, the optical refractive index of the bonding layer 132 can also be set to a different refractive index value if no exact adjustment is possible or if this is desirable or necessary for other reasons or contributes to the optimization of the component.

Figure 3E:
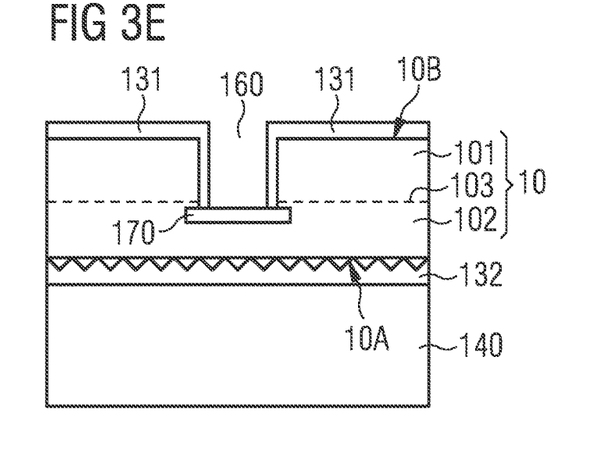

FIG. 3E shows a fifth step of a method for manufacturing an optoelectronic component 1 according to a third exemplary embodiment, in which first the growth substrate 150 is detached from the semiconductor body 10. This creates a second radiation exit surface 10B on the side of the first region 101 facing away from the active region 103. Then a recess 160, starting from the second radiation exit surface 10B, is introduced in the first region 101. The recess completely penetrates the first region 101 and the active region 103. A radiation transmissive dielectric layer 131 is applied to the second radiation exit surface 10B and the walls of the recess 160. A contact region 170 is created through the recess 160, for example by diffusion and/or implantation of zinc, carbon and/or magnesium.

Figure 3F:
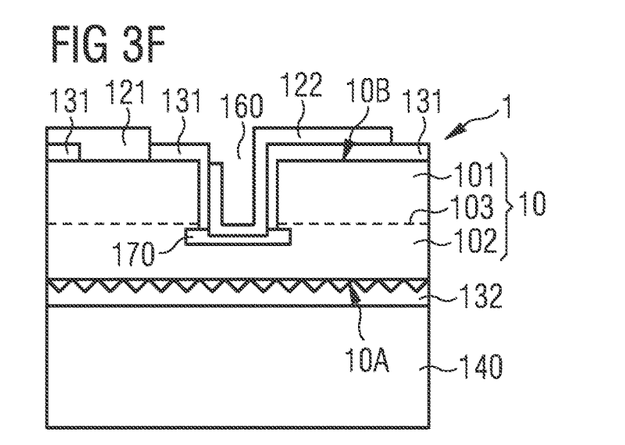

FIG. 3F shows a sixth step of a method for manufacturing an optoelectronic component 1 according to the third exemplary embodiment. A first electrical connection layer 121 is applied to the radiation exit surface 10B, which electrically contacts the first region 101 of the semiconductor body 10. Furthermore, a second electrical connection layer 122 is applied, which serves for electrical contacting of the second region 102 of the semiconductor body 10 and is arranged at least partially in the recess 160. The contact region 170 is completely within the second region 102 of the semiconductor body 10 and is directly adjacent to the second electrical connection layer 122.

Figure 4A:
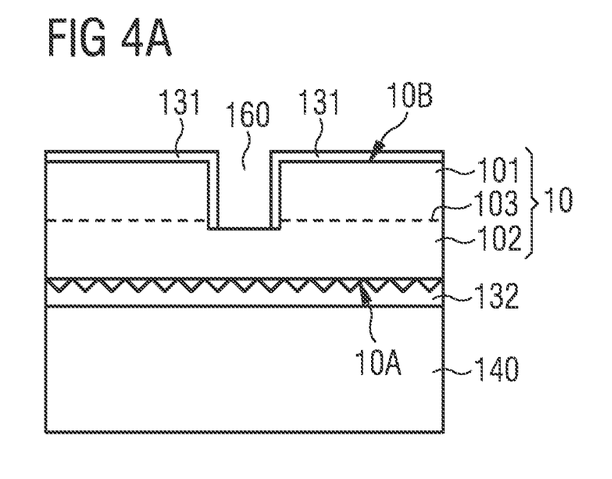
FIGS. 4A and 4B illustrate schematic cross-sections through an optoelectronic component according to a fourth exemplary embodiment in different steps of a method for its manufacturing.

FIG. 4A shows a method step for manufacturing an optoelectronic component 1 according to a fourth exemplary embodiment. The preceding method steps of the fourth exemplary embodiment correspond to the method steps of the third exemplary embodiment shown in FIGS. 3A to 3D. In the fifth method step shown in FIG. 4A according to the fourth exemplary embodiment, the growth substrate 150 is detached from the semiconductor body 10 and thus a second radiation exit surface 10B is produced on the side of the first region 101 facing away from the active region 103. Then a recess 160 is introduced in the first region 101. A radiation transmissive dielectric 132 is applied to the second radiation exit surface 10B.

Figure 4B:
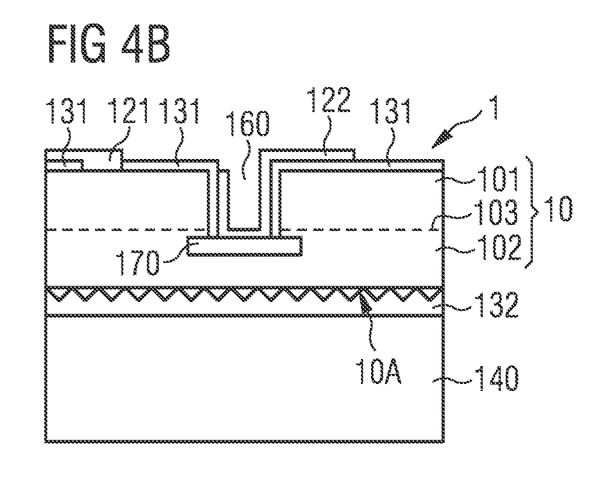

FIG. 4B shows a method step for manufacturing an optoelectronic component 1 according to the fourth exemplary embodiment, in which a first electrical connection layer 121 is applied to the second radiation exit surface 10B for making electrical contact with the first region 101 of the semiconductor body 10. A second electrical connection layer 122 for electrically contacting the second region 102 of the semiconductor body 10 is arranged at least partially in the recess 160. To establish the electrical contact, a contact region 170 is formed at the interface of the second electrical connection layer 122 and the second region 102 of the semiconductor body 10 by means of a high-temperature process step.

The invention is not limited by the description based on the exemplary embodiments. Rather, the invention includes each new feature and each combination of features, which in particular includes each combination of features in the patent claims, even if that feature or combination itself is not explicitly stated in the patent claims or exemplary embodiments.

REFERENCE SIGN LIST 1 optoelectronic component
10 semiconductor body
10A first radiation exit surface
10B second radiation exit surface
101 first region
102 second region
103 active region
121 first electrical connection layer
122 second electrical connection layer
131 dielectric layer
132 bonding layer
140 carrier
150 growth substrate
160 recess
170 contact region

The invention claimed is:

1. An optoelectronic component comprising:
a semiconductor body comprising:
a first region of a first conductivity type; wherein the first region comprises a recess therein;
a second region of a second conductivity type; and
an active region disposed between the first region and the second region;
a contact region adjacent to the recess;
wherein:
the active region of the semiconductor body is designed to emit electromagnetic radiation;
the semiconductor body has a first radiation exit surface at a main surface of the second region facing away from the active region;
at least part of the electromagnetic radiation generated in operation exits the semiconductor body through the first radiation exit surface;
the semiconductor body comprises a first electrical connection layer and a second electrical connection layer, wherein the second electrical connection layer is arranged at least partially in the recess; and
a radiation transmissive carrier is arranged downstream from the first radiation exit surface, wherein the radiation transmissive carrier is materially bonded to the semiconductor body by a radiation transmissive bonding layer;
wherein the extent of the contact region along the main extension plane of the semiconductor body corresponds to the extent of the recess along the main extension plane of the semiconductor body.

2. The optoelectronic component according to claim 1, wherein the second region of the semiconductor body comprises a gallium phosphide compound semiconductor material.

3. The optoelectronic component according to claim 1, wherein the recess does not completely penetrate the first region of the semiconductor body.

4. The optoelectronic component according to claim 1, wherein the radiation transmissive bonding layer comprises a benzocyclobutene-based polymer, a silicon oxynitride, a titanium oxide, an aluminum oxide, or combinations thereof.

5. The optoelectronic component according to claim 4, wherein the optical refractive index of the radiation transmissive bonding layer differs from the optical refractive index of the radiation transmissive carrier by a maximum of 10%.

6. The optoelectronic component according to claim 1, wherein the main surface of the first region of the semiconductor body facing away from the active region further comprises a second radiation exit surface thereon, through which at least part of the generated electromagnetic radiation exits the semiconductor body.

7. The optoelectronic component according to claim 6, wherein the first radiation exit surface and/or the second radiation exit surface are roughened.

8. A method of manufacturing an optoelectronic component, wherein the method comprises:
providing a growth substrate having a semiconductor body grown thereon,
wherein the semiconductor body comprises:
a first region of a first conductivity type,
a second region of a second conductivity type, wherein the first region is
disposed between the growth substrate and the second region, and
an active region disposed between the first region and the second region;
forming a contact region in the second region of the semiconductor body;
depositing a radiation transmissive bonding layer on a first radiation exit surface;
arranging a radiation transmissive carrier on the side of the radiation transmissive bonding layer remote from the second region;
detaching the growth substrate from the side of the first region remote from the active region;
forming a recess in the first region, wherein the recess extends transversely to the main plane of extension of the first region and extends to the contact region; and
depositing a first electrical connection layer and a second electrical connection layer on the side of the first region facing away from the active region, wherein the second electrical connection layer is arranged at least partially in the recess, wherein
a doping material is introduced during the forming of the contact region; or
the forming of the contact region occurs after depositing the first electrical connection layer, and wherein the second electrical connection layer is electrically conductively connected to the second region by means of a high-temperature process during the forming of the contact region.

9. The method for producing an optoelectronic component according to claim 8, wherein the surface of the second region facing away from the active region is roughened to produce a first radiation exit surface before or after the forming of the contact region in the second region.

10. The method of manufacturing an optoelectronic component according to claim 8, wherein the surface of the first region facing away from the active region is roughened to produce a second radiation exit surface after detaching the growth substrate.

11. The method of manufacturing an optoelectronic component according to claim 8, wherein
the entire contact region has a conductivity of the second conductivity type.

12. The method of manufacturing an optoelectronic component according to claim 11, wherein
the contact region of a second conductivity type extends into the first region; and
the recess does not completely penetrate the first region transversely to the main extension plane of the first region.

13. The method of manufacturing an optoelectronic component according to claim 8, wherein
forming the contact region in the second region occurs after forming the recess in the first region;
a doping material is introduced during the forming of the contact region; and
the entire contact region has a conductivity of the second conductivity type.

14. An optoelectronic component comprising:
a semiconductor body comprising:
a first region of a first conductivity type,
a second region of a second conductivity type, and
an active region disposed between said first region and said second region;
a recess in the first region of the semiconductor body;
a contact region adjacent to the recess;
wherein:
a doping material of the second conductivity type is in the contact region;
the active region of the semiconductor body is designed to emit electromagnetic radiation;
the semiconductor body comprises a first radiation exit surface at a main surface of the second region facing away from the active region;
at least a portion of the electromagnetic radiation generated in operation exits the semiconductor body through the first radiation exit surface;
the semiconductor body comprises a first electrical connection layer and a second electrical connection layer; wherein the second electrical connection layer is arranged at least partially in the recess; and
a radiation transmissive carrier arranged downstream from the first radiation exit surface, wherein the radiation transmissive carrier is materially bonded to the semiconductor body by means of a radiation transmissive bonding layer.

* * * * *